(12) United States Patent
Quinton et al.

(10) Patent No.: US 9,536,625 B1
(45) Date of Patent: Jan. 3, 2017

(54) CIRCUITRY AND METHOD FOR CRITICAL PATH TIMING SPECULATION IN RAMS

(71) Applicant: Abreezio, LLC, Sunnyvale, CA (US)

(72) Inventors: Bradley Quinton, Vancouver (CA); Trent McClements, Burnaby (CA); Andrew Hughes, Vancouver (CA); Sanjiv Taneja, Cupertino, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 14/800,528

(22) Filed: Jul. 15, 2015

Related U.S. Application Data

(60) Provisional application No. 62/183,092, filed on Jun. 22, 2015.

(51) Int. Cl.
*G11C 11/00* (2006.01)
*G11C 29/02* (2006.01)
*G11C 11/413* (2006.01)

(52) U.S. Cl.
CPC ........... *G11C 29/023* (2013.01); *G11C 11/413* (2013.01); *G11C 29/022* (2013.01); *G11C 29/028* (2013.01)

(58) Field of Classification Search
CPC ..... G11C 29/52; G11C 16/3454; G11C 16/10; G11C 16/12; G11C 16/24; G11C 16/3436; G11C 16/344; G11C 29/34; G11C 29/785; G11C 8/12; G11C 7/22; G11C 11/4096; G11C 7/10; G11C 7/1006

USPC .... 365/230.03, 200, 230.06, 230.01, 189.05, 365/205, 210.1, 230.08, 189.15, 233.1, 365/185.11, 185.2, 189.011, 189.14, 365/189.16, 189.17, 196
See application file for complete search history.

(56) References Cited

U.S. PATENT DOCUMENTS 6,421,789 B1 * 7/2002 Ooishi ................... G11C 29/14
365/201
6,693,818 B2 * 2/2004 Shiga ........................ G11C 8/10
365/185.22

* cited by examiner

*Primary Examiner* — Thong Q Le
(74) *Attorney, Agent, or Firm* — Smith Tempel Blaha LLC

(57) ABSTRACT

User data or constantly toggling functional critical path timing sensors measure delays in actual critical paths that include a RAM. Variable resistors or variable capacitors are added to RAM bit lines for redundant cells to delay bit-line sensing by sense amplifiers. The sense amplifiers' delayed data is compared to non-delayed data from normal selected RAM cells to detect timing failures. Variable resistors or capacitors may also be added between the write drivers and bit lines to delay writing data into the redundant cells. A margin delay adjustment controller sweeps margin delays for constantly toggling paths until failures. A margin delay is then adjusted and added to functional critical paths that carry user data. Functional critical path timing sensors test setup time with the added margin delay. Timing failures cause VDD to increase, while a controller reduces VDD when no failures occur. Actual delays through the RAM adjust VDD.

30 Claims, 12 Drawing Sheets

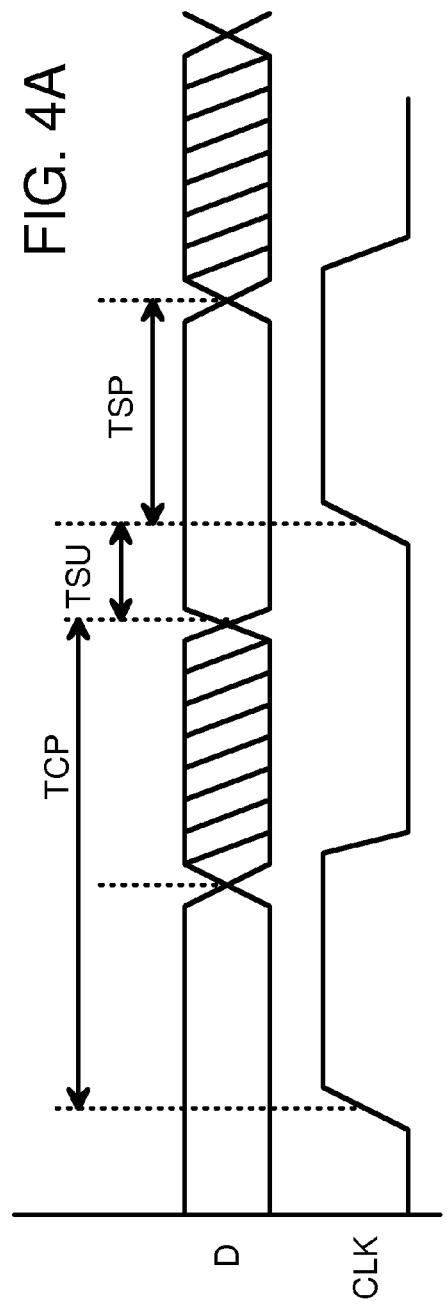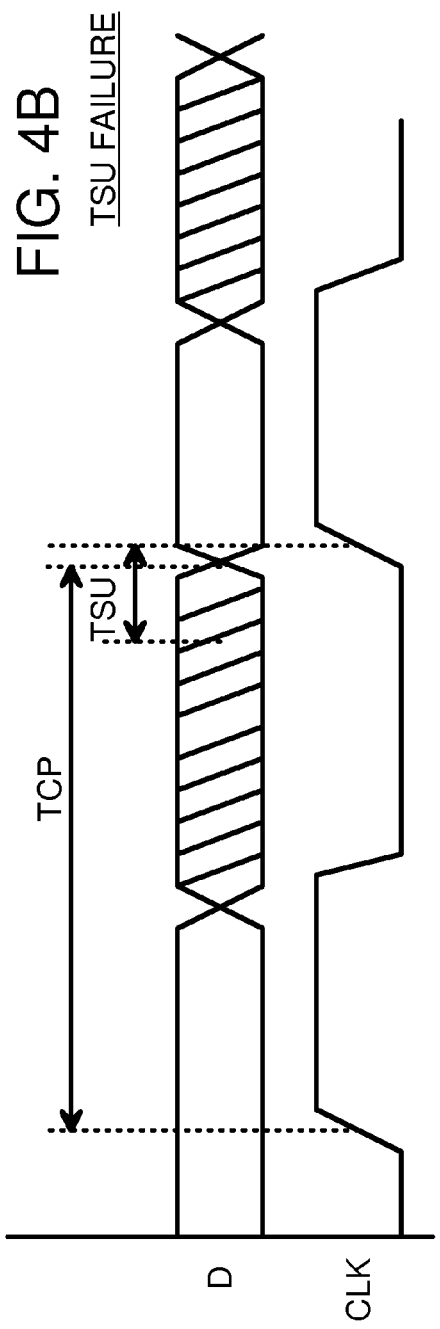

CIRCUITRY AND METHOD FOR CRITICAL PATH TIMING SPECULATION IN RAMS

RELATED APPLICATION

This application is a non-provisional of the provisional application for "Circuitry and Method for Critical Path Timing Speculation in RAMs". U.S. Ser. No. 62/183,092, filed Jun. 22, 2015.

FIELD OF THE INVENTION

This invention relates to on-chip delay sensing, and more particularly to measuring timing delays in a memory array to adjust the power-supply voltage.

BACKGROUND OF THE INVENTION

Semiconductor memory devices are specified (spec'ed) to operate within certain parameters, such as a maximum power draw and a maximum clock frequency. While semiconductor manufacturing processes are very precise, process variations do occur. Although the manufacturing process may target a typical device, sometimes process variations produce slower chips or faster chips. As device sizes shrink, larger relative variations may occur.

Chips may be tested to determine their power draw and speed, and these chips may be sorted into slow-chip bins, fast-chip bins, and typical-chip bins. The faster chips may be sold as faster speed grades, while the slower chips may be sold for slower speed grades. Unfortunately, such process skews are not always reproducible or planned but may occur randomly, making for logistical difficulties. Therefore all process skews are often lumped together. The slowest expected process skews determine the specified speed of the device, while the fastest expected process skews determine the specified maximum power dissipation.

FIG. 1 is a graph showing how process variations affect device specifications. The slowest process skew (SS) has the lowest power and the lowest performance or speed. A typical process (TT) has a better power and performance product. The fastest process skew (FF) has the highest performance and speed, but also consumes the most power.

All three process skews—slow, typical, and fast, share the same device specifications when no grade sorting is performed. Devices produced with the slowest process determine the speed specs such as the maximum clock frequency, or the minimum clock-to-output delay times. However, the fast devices consume more power than do the slower devices, so power specs are determined by devices manufactured by the fast process skews. The power-supply voltage VDD is usually fixed.

The performance and power specs are determined by the worst-case devices over the expected process skews. Slow devices set the speed specs and fast devices set the power specs. This is not optimal, since fast devices are spec'ed slower than they can actually operate, and slow devices actually draw less power than spec'ed.

Specialized sensors may be added to chips to facilitate at-speed testing. Dummy bit lines have been added to RAM arrays to adjust bit-line sensing circuits. An oscillator or a canary circuit may be added to track process variations. However, the actual circuit may be much more complex than an oscillator, resulting in tracking errors. For logic chips, a dummy path and an on-chip timing sensor may be added. The timing sensor can report its results to a tester or even to an on-chip controller that can adjust operating conditions, such as to slow down or stop a clock to reduce power consumption.

It is desired to adjust or scale the internal power-supply voltage VDD to account for measured process variations. It is desired to add a timing sensor to an actual critical path on a chip that includes a memory array so that the timing sensor is measuring the delay of the same physical path and memory array that carries functional data during operation of the chip. It is desired to have a margin controller measure timing delays on a dummy path, and then use the results to adjust a variable timing margin on other critical paths.

BRIEF DESCRIPTION OF THE DRAWINGS

FIGS. 4A-B are timing diagrams showing critical-path timing success and failure.

DETAILED DESCRIPTION

The present invention relates to an improvement in measuring timing margins in critical paths that include a RAM array. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors realize that test data patterns can be applied to a dummy path, and slowing of that dummy path can be measured. The measured delay can then be used to adjust added timing margins in other sensors on the chip. The added timing margin accounts for the actual conditions measured.

Some logic chips may also contain RAM arrays. These RAM arrays may have different electrical characteristics that make the RAM arrays have a different dependence on VDD, temperature, and process variations than do logic gates. A critical path may contain both logic gates and the RAM array.

Actual functional critical paths that include both a RAM array and logic gates are measured rather than a dummy path. Tracking errors are eliminated. The sensor results may be used to speed up or slow down the chip by adjusting power-supply voltage VDD. Process skews cause timing variations in the functional critical paths which are measured by the sensors and then compensated for by adjusting VDD. Conditions measured on the dummy paths are accounted for by increasing the margin delays in the functional critical path timing sensors.

Figure 2:
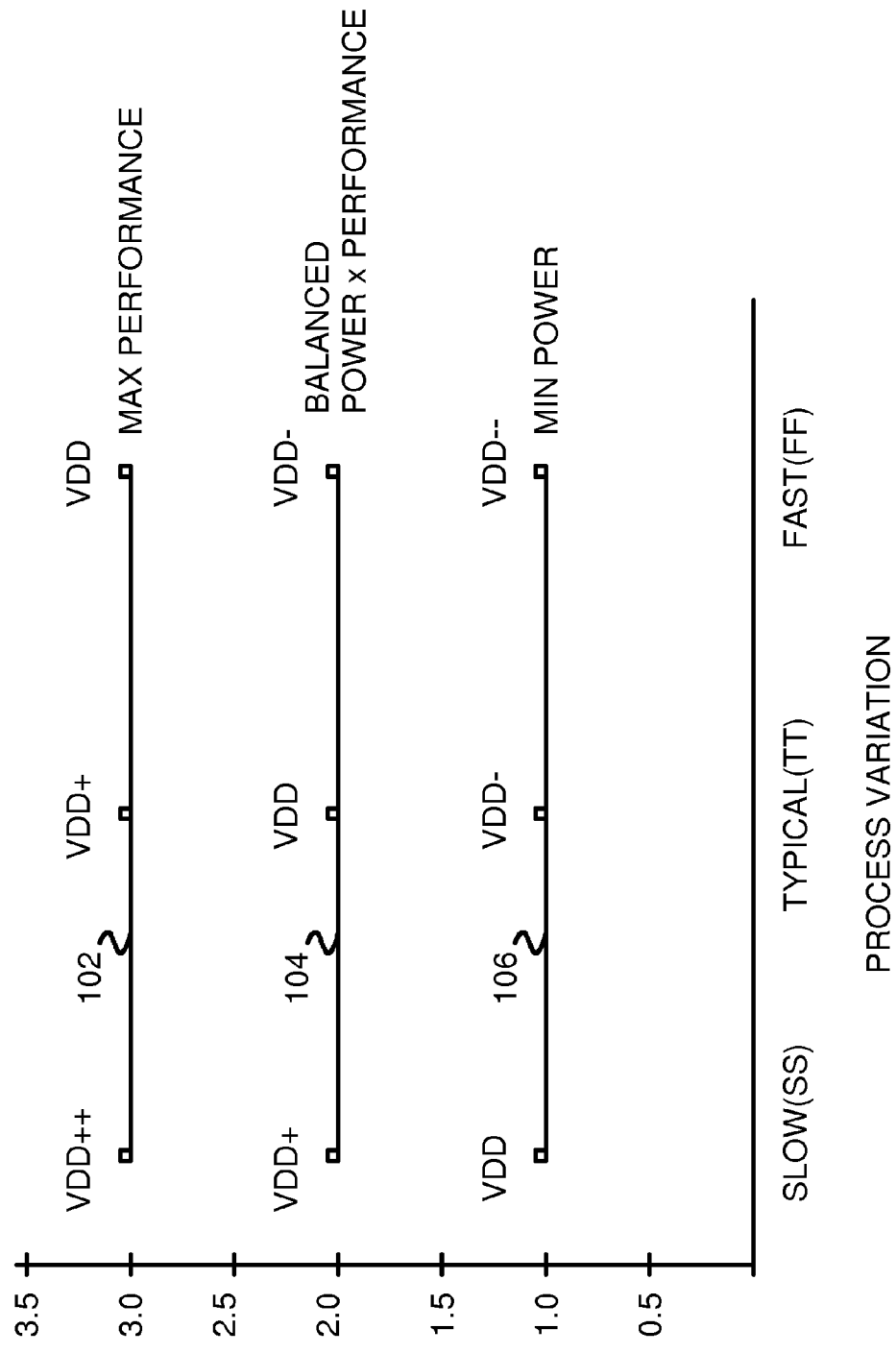
FIG. 2 is a graph showing adjusting VDD to compensate for process skews.

FIG. 2 is a graph showing adjusting VDD to compensate for process skews. On-chip sensors accurately measure timing delays in functional critical paths that include both a RAM array and logic gates. Since the actual critical-path delays are precisely measured, less of a guard band is needed in the chip specifications. Process skews are accurately accounted for, so either the performance or the power spec may be increased. Since current process, voltage, circuit aging, and temperature conditions are measured and accounted for by adjusting margin delays of the other sensors, less of a guard band is needed when the manufacturer specs the chip.

When performance is maximized, curve 102 shows that the fast process skew chips are powered by VDD and determine the performance specs. The internal power supply to the typical chip is increased to VDD+ to increase its performance to match the performance of the fast-process chip. The internal power supply to the slow-process chip is increased further to VDD++ so the slow-process chip can also meet the timing spec of the fast-process chip. Since the maximum power consumption spec is determined by the fast-process chip operating at VDD (See FIG. 1), the typical and slow chips will consume less than the spec'ed power when powered at VDD. The amount of increase in VDD to VDD+ and VDD++ can be chosen so that the maximum power spec is not exceeded. Thus the slow and typical chips still consume less than the spec'ed power but also have increased performance using curve 102.

Figure 1:
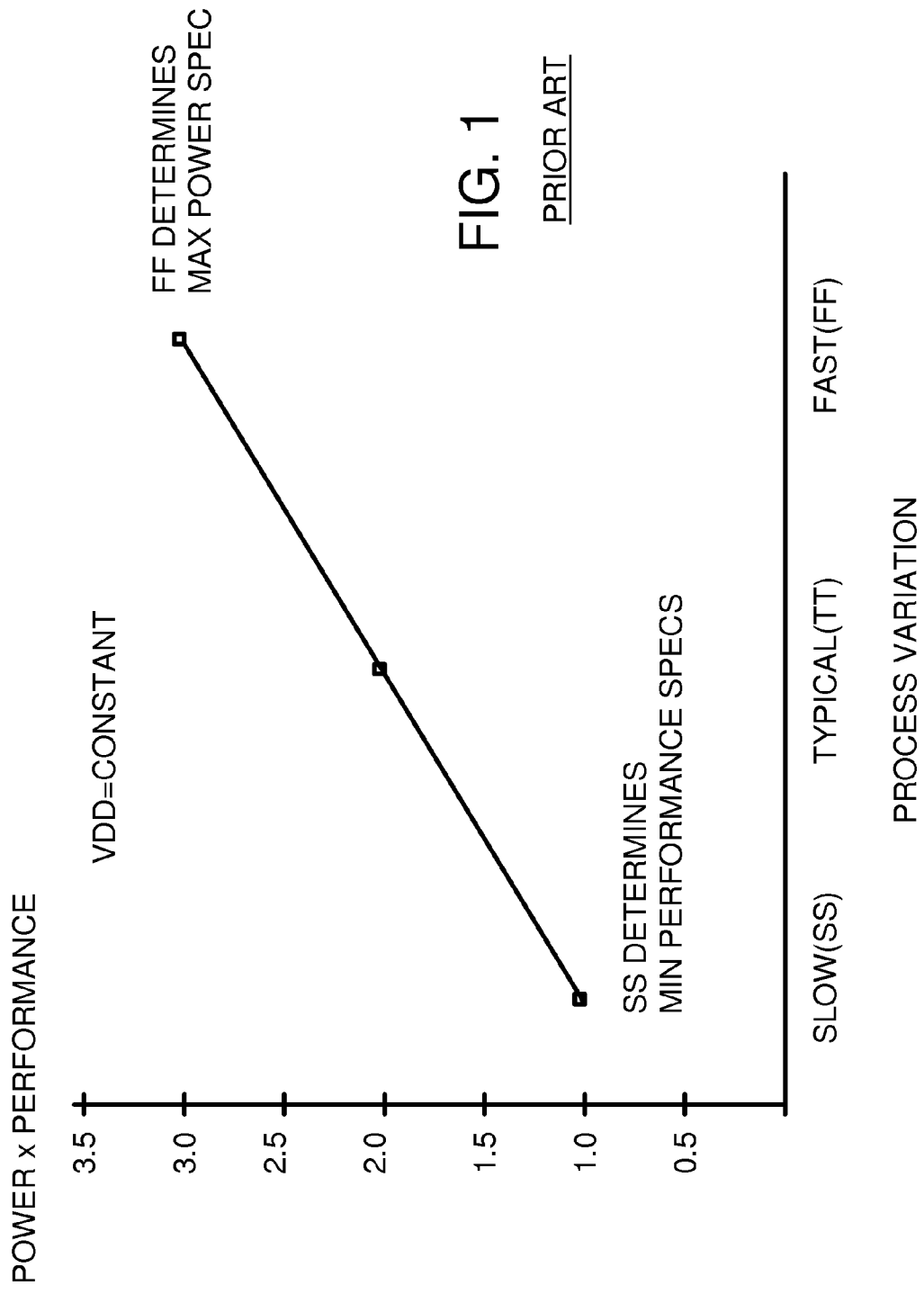
FIG. 1 is a graph showing how process variations affect device specifications.

When reducing power is more important than increasing performance, such as for battery-powered applications, curve 106 is used. The slow-process chip is powered by VDD and sets the performance specs (FIG. 1). However, since the typical and fast-process chips are inherently faster at the same nominal VDD, their internal power supplies are decreased to VDD– and VDD–– so that the same performance spec is reached but power consumption is reduced.

Curve 104 shows a balanced approach. When the internal critical-path sensors determine that the chip was made using a typical process, this typical-process chip is powered with the nominal VDD. Power is less than the maximum spec'ed by the fast-process chips and performance is better than the minimum spec'ed by the slow-process chips.

When the critical-path timing sensors determine that the chip is a fast-process chip, even when the actual wear is accounted for, the internal VDD is reduced to VDD–. This reduces power consumption while maintaining performance. When the critical-path timing sensors determine that the chip is a slow-process chip, the internal VDD is raised to VDD+. This increases performance while maintaining power consumption.

Thus by measuring the timing of actual critical paths, and by adjusting for the actual conditions detected, the internal power supply to internal circuits and Ram array is adjusted up or down to compensate for process skews. The chip may operate at higher performance or power may be saved. Thus chip operation is optimized for the process skew that the chip was manufactured with, and adjusted as conditions change in the chip over its lifetime.

Figure 3:
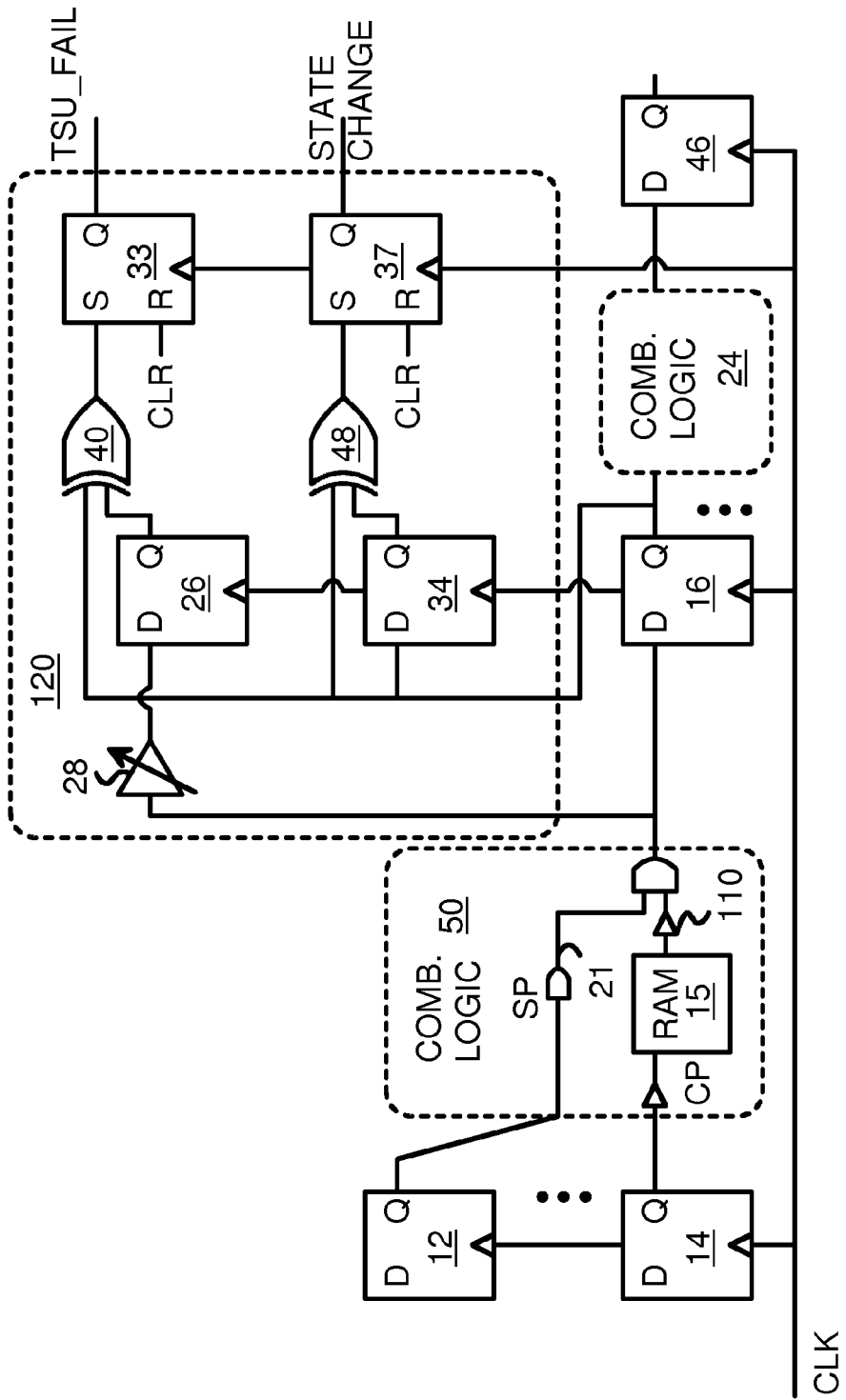
FIG. 3 shows a RAM in a functional critical path with an added margin delay to detect failures before they occur, with accumulators and state change detection.

FIG. 3 shows a RAM in a functional critical path with an added margin delay to detect failures before they occur, with accumulators and state change detection. Critical path 110 is an actual mixed functional critical path, such as with RAM 15 and logic gates between two flip-flops within a logic block powered by VDD. RAM 15 is a static random-access memory (SRAM) or dynamic-random-access memory (DRAM) array that has a timing dependence on VDD, temperature, and process variations.

Flip-flops 12, 14, 16, 46 are clocked by CLK and may have data scanned into them during a test mode, such as by using Level-Sensitive Scan Design (LSSD) and similar techniques. Combinatorial logic 50 includes logic gates and RAM 15 between first-level flip-flops 12, 14 and next-level flip-flop 16. When the rising edge of CLK occurs, the Q outputs of first-level flip-flops 12, 14 change, and this change propagates through RAM 15 in functional critical path 110 and short path 21 within combinatorial logic 50 to the D input of next-level flip-flop 16. RAM 15 may not be a part of short path 21.

When the set-up time to next-level flip-flop 16 is met, the correct data is clocked into next-level flip-flop 16, and then passes through combinatorial logic 24 to third-level flip-flop 46. An actual circuit has many more flip-flops at each level than shown. During normal operation, data and control signals are clocked through the flip-flops. However, during a test mode the test data is scanned into the flip-flops, which may include muxes on their D inputs and/or a separate test clock.

Once the desired test data is clocked into the flip-flops, CLK is pulsed, allowing the test data from first-level flip-flops 12, 14 to flow through RAM 15 and functional critical path 110 and short path 21 to the D input of next-level flip-flop 16. When the set-up timing requirement is met, the correct data is clocked into next-level flip-flop 16 and appears at the Q output.

In some embodiments, RAM 15 may be an asynchronous RAM, with logic being applied to its address inputs, and data being read and output after an address-to-data access time, $T_{AA}$. In other embodiments, RAM 15 may be a synchronous RAM and may be clocked by CLK or a derivative. Data may require a multiple of CLK cycles to be output from RAM 15.

Test mode is not required for timing measurements. Normal user or other chip data and control information may have a sufficient number of state changes to allow for testing, especially if several different functional critical paths are tested, or if test software selects paths with a higher frequency of state change. However, it is undesirable to have actual failures occur during normal chip operation. A test flip-flop with an added set-up-time delay is added in parallel to flip-flop 16 to detect errors before they would occur in flip-flop 16.

Such an added timing margin may be included in the critical path sensors. Margin delay buffer 28 receives the D input to next-level flip-flop 16 and adds a margin delay before driving the D input of early capture flip-flop 26. Both next-level flip-flop 16 and early capture flip-flop 26 are clocked by the same CLK, but margin delay buffer 28 increases the effective required set-up time to early capture flip-flop 26. The test data through RAM 15 and functional critical path 110 must arrive at least the margin delay of margin delay buffer 28 earlier to avoid a timing failure early capture flip-flop 26. As the delay through RAM 15 and functional critical path 110, TCP, is slowly increased, early capture flip-flop 26 will capture a timing failure before next-level flip-flop 16 does. Thus the functional logic is not subjected to a failure that could disrupt operations later.

XOR gate 40 compares the Q outputs of early capture flip-flop 26 and of next-level flip-flop 16 to generate a timing failure signal that sets accumulator 33 and set-up timing failure signal TSU_FAIL. Thus critical path timing sensor 120 captures an early timing failure before the functional path's flip-flop experiences a timing failure. Timing failures in the functional paths (next-level flip-flop 16) are predicted rather than detected while still using the actual RAM 15 and functional critical path 110 for combinatorial logic. The differences in electrical characteristics between next-level flip-flop 16 and early capture flip-flop 26 are less important since margin delay buffer 28 adds a delay that is likely larger than any differences between flip-flops 16, 26.

The previous state is sampled from the Q output of next-level flip-flop 16 by the D input of previous state flip-flop 34. XOR gate 48 compares the D and Q terminals of previous state flip-flop 34. A high from XOR gate 48 indicates a state change, and sets accumulator 37 when CLK goes high.

Accumulators 33, 37 are 1-bit saturating counters that are clocked by CLK and cleared by controller 130 (FIG. 5) asserting CLR to reset input R. Critical path timing sensor 120 accumulates timing failures that can be examined by controller 130 at a later time, possibly reducing the workload of controller 130. Controller 130 can periodically check the values in accumulators 33, 37 and then adjust VDD upward when both accumulators are high, indicating that a valid state change occurred when a timing failure occurred. When accumulator 37 is high, indicating a state change, but accumulator 33 is low, indicating no timing failure has occurred, VDD can be lowered. When the accumulators are still cleared when controller 130 checks them after some period of time, indicating that no valid timing error occurred, then controller 130 can decrease VDD by another increment.

Controller 130 executes a control loop to adjust VDD and then check for timing errors. Controller 130 could perform this control loop and VDD adjustment only during a test mode, or during normal operation. Making VDD adjustments during a test mode could allow for speed-grading parts during manufacture. The final VDD may be set during testing. In another embodiment, VDD is adjusted during normal operation. This permits adaptive adjustment in the field to compensate for temperature variation or device aging. Adaptive in-the-field adjustment may use voltage regulators, feedback loops and controllers that are not needed with the embodiment that tests and adjusts VDD only during manufacturing test.

FIGS. 4A-B are timing diagrams showing critical-path timing success and failure. In FIG. 4A, the D input to a D-type flip-flop receives a signal generated by functional critical path 110 with RAM 15 of FIG. 3. The flip-flops are clocked by the rising edge of clock CLK. When CLK rises, data from the outputs of upstream flip-flops travel through various paths to the inputs of the next logical level of flip-flops. The changing signals must propagate through the various paths and arrive at the D inputs of the next level of flip-flops at least a set-up time TSU before the next rising edge of CLK. The slowest path is the critical path with RAM 15 that has a delay of TCP.

Several other paths may converge with this critical path. The fastest of these converging paths has a shortest path delay of TSP. After each rising clock edge of CLK, the D input to the next level of flip-flop can begin to change TSP after the CLK edge, and may continue to change until TCP. In FIG. 4A, TCP occurs just before the required TSU, so timing does not fail. The correct data is clocked into the next-level flip-flop.

In FIG. 4B, a timing failure occurs. The clock may be running at a higher frequency in FIG. 4B than in FIG. 4A, a lower VDD, a higher temperature, a slower-process chip may be shown, or the chip may have aged or otherwise degraded.

The critical path delay TCP is larger relative to the clock period so that the D input is still changing after TSU. The correct data through RAM 15 and other logic in the critical path does not arrive at D until after TSU, so the wrong data may get clocked into the next-level flip-flop. A set-up timing error occurs.

Figure 5:
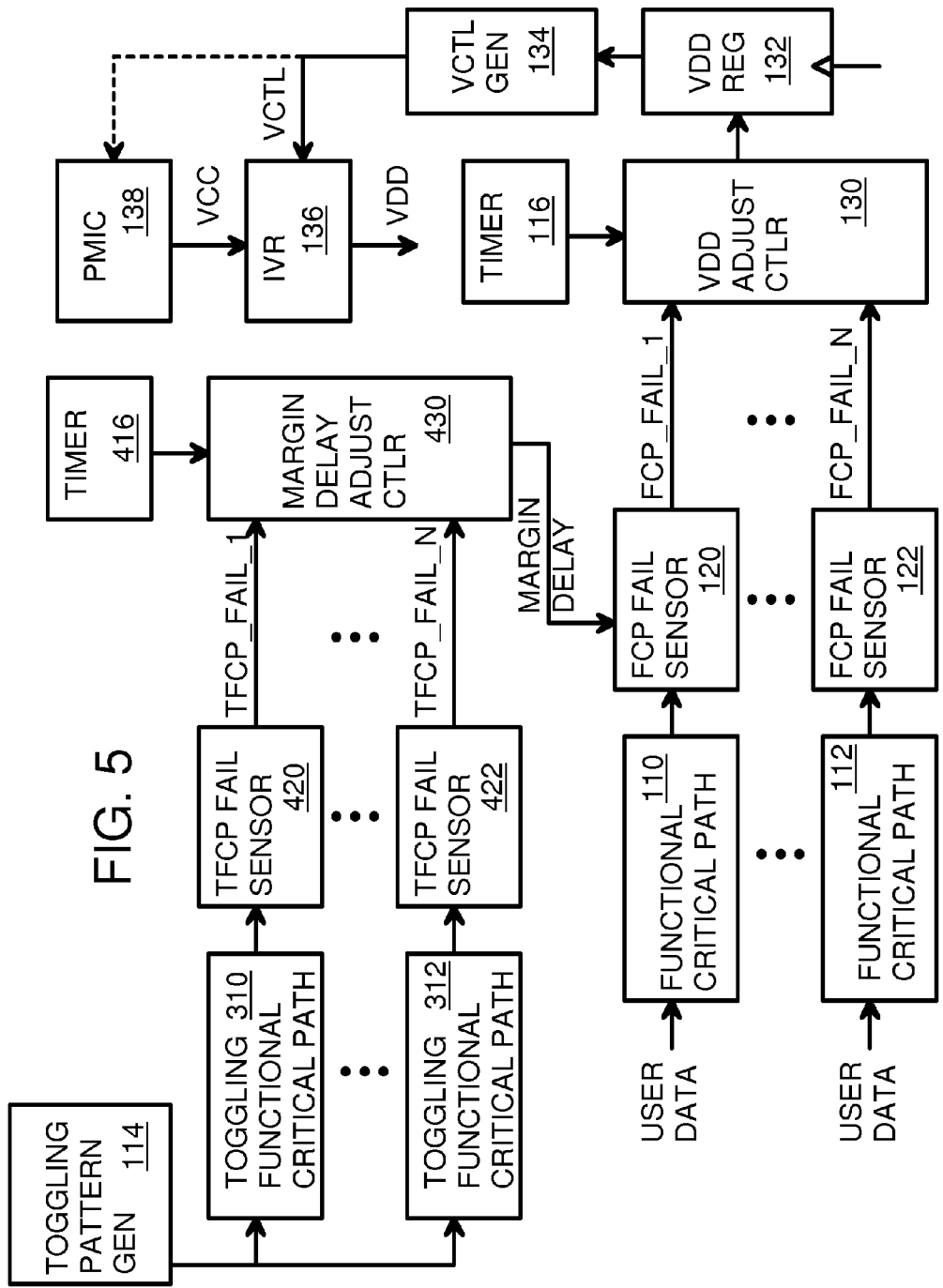
FIG. 5 is a block diagram with a controller that adjusts the internal power supply in response to RAM and critical path timing measurements and another controller that adjusts margin delay to account for measured-measured test conditions.

FIG. 5 is a block diagram with a controller that adjusts the internal power supply in response to RAM and critical path timing measurements and another controller that adjusts margin delay to account for measured-measured test conditions.

Toggling pattern generator 114 generates test patterns that toggle frequently. High-transition density patterns may be generated with a toggle flip-flop. The toggling test patterns are input to toggling functional critical paths 310, . . . 312. Toggling functional critical paths 310, . . . 312 are dummy paths that do not carry user data or chip controls. However, toggling functional critical paths 310, . . . 312 may still include a RAM 15. Thus failure of toggling functional critical paths 310, . . . 312 does not cause chip operation to fail. Toggling functional critical paths 310, . . . 312 can safely be used at an accelerated rate.

The toggling test patterns pass through toggling functional critical paths 310, . . . 312 and are sensed by toggling functional critical path timing sensors 420, . . . 422. Failure signals TFCP_FAIL_1, TFCP_FAIL_2, . . . TFCP_FAIL_N are generated by toggling functional critical path timing sensors 420, . . . 422 when the toggling test patterns do not meet the set-up time requirements, such as when toggling functional critical paths 310, . . . 312 with a RAM 15 have slowed in performance due to changes in conditions.

Margin delay adjustment controller 430 measures the timing margins of toggling functional critical paths 310, . . . 312. When no failures are detected within a period of time indicated by timer 416, margin delay adjustment controller 430 adjusts toggling functional critical path timing sensors 420, . . . 422 to use a larger margin delay until failures occur. Then the final margin value before failures occur can be used by critical path timing sensors 120, . . . 122.

Critical path 110 is an actual functional critical path, such as with RAM 15 and logic gates between two flip-flops within a logic block powered by VDD. User data, controls, or other information required by normal chip operation is clocked into functional critical paths 110, . . . 112. During a test mode, test data may pass through critical paths 110, . . . 112 with RAM 15 to critical path timing sensors 120, 122. Critical path timing sensors 120, 122 determine when the user data or test data did not meet the set-up timing requirement to the next flip-flop, and then activate timing failure signals TSU_FAIL_1, TSU_FAIL_2, . . . TSU- _FAIL_N to controller 130. The set-up timing requirements include the margin delay from margin delay adjustment controller 430. For example, margin delay adjustment controller 430 can set or adjust the margin delay of margin delay buffer 28 in critical path timing sensors 120 of FIG. 3.

Controller 130 receives the timing failure signals from critical path timing sensors 120, 122 and signals adjustments for VDD. When one or more valid timing failure signals are received, controller 130 increases VDD by some increment by writing a value into VDD register 132 that causes VDD to increase. When no timing failure signals are received during a period of time set by timer 116, controller 130 may decrease VDD by writing a smaller value to VDD register 132. Controller 130 may use various routines and procedures to test out different VDD voltages and then to back away from a level of VDD that causes failures to provide a guard band.

Power Management Integrated Circuit (PMIC) 138 is an external IC that generates a VCC power supply applied to a chip. Integrated Voltage Regulator (IVR) 136 receives VCC on an external pin and generates a regulated internal power supply voltage VDD. IVR 136 could be a Low-Drop Out (LDO) regulator or a Switching Mode Power Supply (SMPS) regulator that are on the substrate with critical paths 110, . . . 112 and supply VDD to all internal components within the same voltage domain, including RAM 15.

The digital value in VDD register 132 is converted to an analog voltage by VCTL control voltage generator 134. This control voltage VCTL is applied to an analog control voltage input to either internal IVR 136 or to external PMIC 138. Control voltage VCTL causes IVR 136 or PMIC 138 to adjust the VDD or VCC generated. Thus controller 130 adjusts VDD in response to timing failure signals from critical path timing sensors 120, 122. The adjusted VDD is applied to all components in the voltage domain, such as RAM 15, functional critical paths 110, 112, critical path timing sensors 120, controller 130, VDD register 132, and VCTL control voltage generator 134. Toggling pattern generator 114, toggling functional critical paths 310, . . . 312, toggling functional critical path timing sensors 420, . . . 422, timer 416, and margin delay adjustment controller 430 may also be in the same VDD domain.

Figure 6:
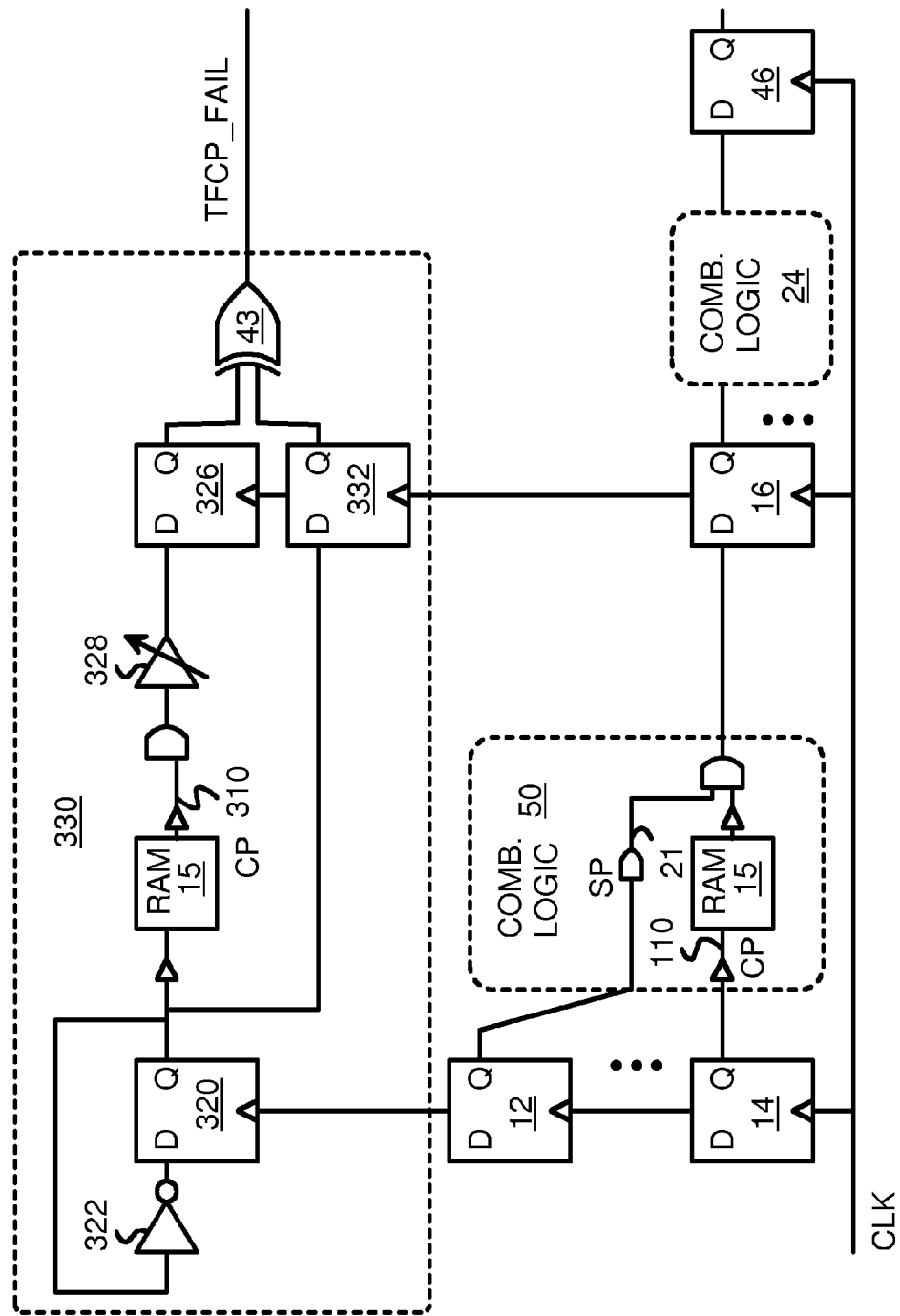
FIG. 6 is a schematic of toggling functional critical paths with a RAM and timing sensors.

FIG. 6 is a schematic of toggling functional critical paths with a RAM, and timing sensors. Toggling sensor 330 may be physically located close to combinatorial logic 50, RAM 15, and functional critical path 110, but does not carry user data and is not functionally connected with the user data path. Since toggling sensor 330 does not carry user data, toggling sensor 330 may continue to operate and sense conditions even when functional critical path 110 is not processing user data and is quiet, without transitions needed to test for timing failures.

Toggling pattern generator 114 is implemented as a toggle flip-flop to maximize the frequency of state transitions. Inverter 322 inverts the Q output of toggle flip-flop 320 to drive its D input. Since the state of toggle flip-flop 320 is changing at each CLK cycle, the transition density is likely higher than any functional critical path 110 since user data rarely changes each for CLK. Thus transitions are accelerated for toggling functional critical path 310 relative to functional critical path 110. Changes in conditions in RAM 15 may be sensed more quickly through toggling functional critical path 310 than through functional critical path 110 by applying continuously toggling data from toggle flip-flop 320.

When the rising edge of CLK occurs, the Q output of toggle flip-flop 320 changes, and this change propagates through toggling functional critical path 310 with RAM 15 and margin delay buffer 328 to the D input of margin detect flip-flop 326.

When the set-up time to margin detect flip-flop 326 is met, the correct data is clocked into margin detect flip-flop 326 and appears on its Q output. As the margin delay of margin delay buffer 328 is increased, eventually the set-up time is violated and the wrong data is clocked into margin detect flip-flop 326.

The Q output of toggle flip-flop 320 is applied as a reference signal directly to the D input of reference flip-flop 332. Since there is little delay between toggle flip-flop 320 and reference flip-flop 332, reference flip-flop 332 always contains the correct data.

After the rising edge of CLK, the Q terminals of margin detect flip-flop 326 and reference flip-flop 332 should be identical. However, if the set-up timing failed, the wrong data is clocked into margin detect flip-flop 326, at the Q terminals likely have different data.

XOR gate 43 compares the Q terminals of margin detect flip-flop 326 and reference flip-flop 332 and signals a timing failure when they are different. When the Q terminals are not in the same state, a failure is detected by XOR gate 43, which generates the toggling functional critical path timing failure signal TFCP_FAIL.

Figure 7:
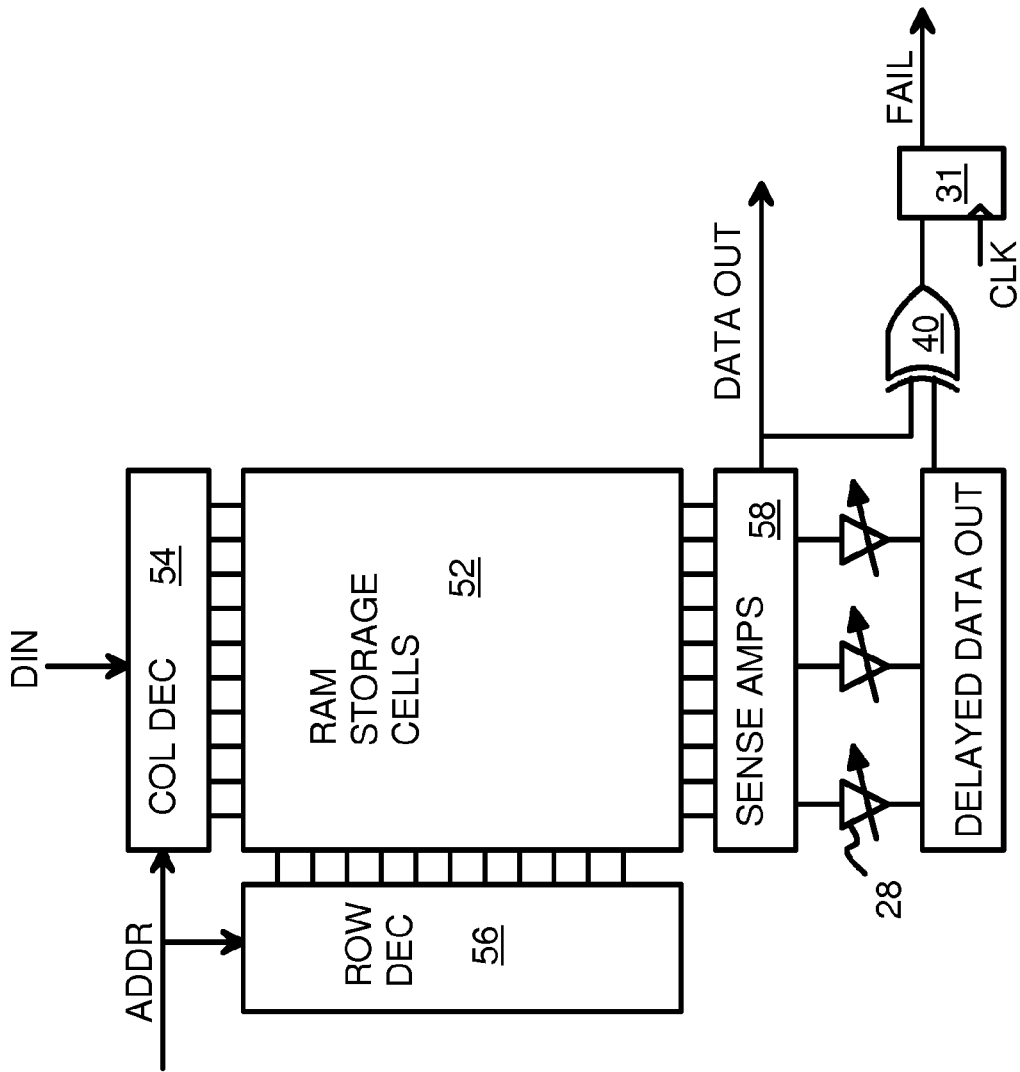
FIG. 7 shows a RAM with an integrated variable margin delay timing sensor.

FIG. 7 shows a RAM with an integrated variable margin delay timing sensor. Functional critical path timing sensors 120 (FIG. 3) and margin delay buffers 28 may be integrated with RAM 15. This integration is especially useful when most of the critical path's timing delay is due to the RAM, or when the RAM requires multiple clock cycles.

A multi-bit address is divided into row and column address bits, and the row address bits are decoded by row decoder 56 to select a row of RAM storage cells 52. The column address bits are decoded by column decoder 54 to select one column of RAM storage cells 52. The column may be several data bits wide. When a W/R control signal indicates write, the data from data input DIN is written into the selected cell. Otherwise, input data DIN is ignored and the data stored in the selected cell in the row and column of RAM storage cells 52 decoded by the address is read.

During reading, sense amplifiers 58 sense the data that the selected RAM storage cell 52 placed on bit lines in the RAM array. The sensed data is amplified to generate DATA_OUT. The sensed data is delayed by margin delay buffers 28 to generate the delayed data out. XOR gate 40 compares the delayed data out to the data out from sense amplifiers 58. The compare result is latched by flip-flop 31 to generate a timing failure signal FAIL. FAIL can be a FCP_FAIL signal or a TFCP_FAIL signal of FIG. 5.

Figure 8:
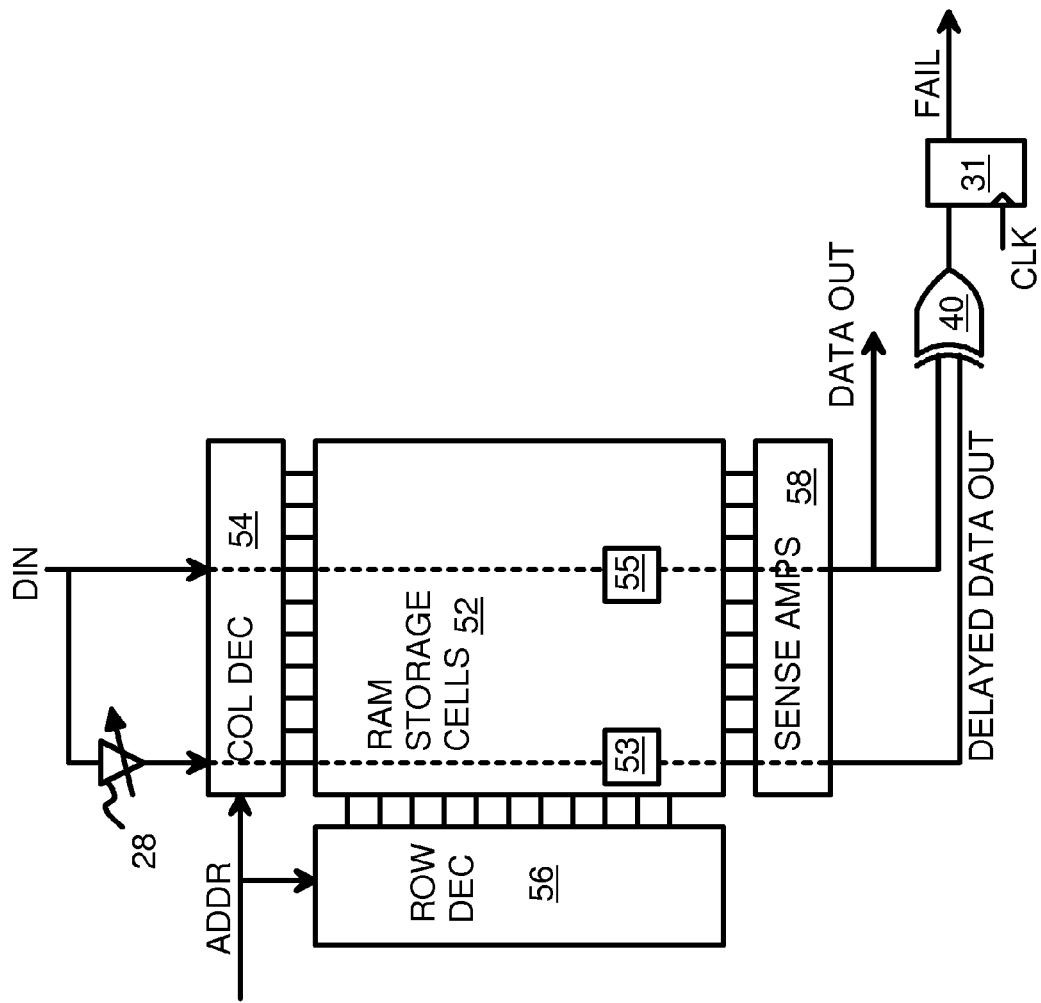
FIG. 8 shows a RAM with a variable margin delay added to write data to a parallel RAM cell.

FIG. 8 shows a RAM with a variable margin delay added to write data to a parallel RAM cell. Input data DIN is written to normal selected cell 55 that is selected by the row and column address, and to redundant cell 53 in RAM storage cells 52. Redundant cell 53 may be in a spare column of cells in RAM storage cells 52 that is pre-selected and dedicated to margin testing.

Write data DIN is written to normal selected cell 55 without any added delay, and to redundant cell 53 with an added delay by margin delay buffer 28. As the delay of margin delay buffer 28 is increased, eventually the wrong data is written into redundant cell 53, while the correct data is still written into normal selected cell 55.

During a subsequent read cycle, sense amplifiers 58 sense both the normal data in normal selected cell 55 and the delayed data in redundant cell 53. When the delay added to the write data by margin delay buffer 28 exceeds the set-up time to redundant cell 53, the wrong data is written into redundant cell 53, and the data read from redundant cell 53 differs from the data read from normal selected cell 55. XOR gate 40 detects this data difference and the result is latched into flip-flop 31 and output as the timing failure signal FAIL.

Figure 9:
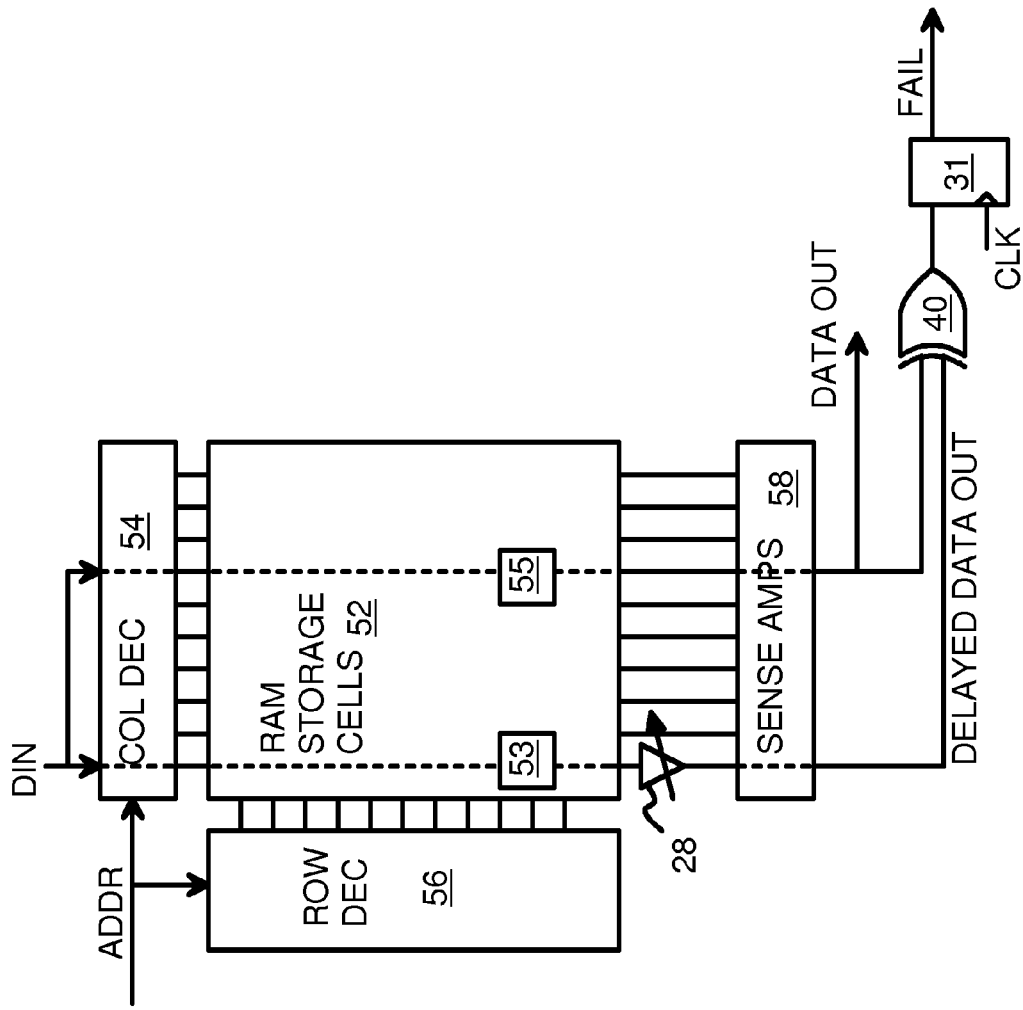
FIG. 9 shows a variable margin delay being added before the sense amplifiers.

FIG. 9 shows a variable margin delay being added before the sense amplifiers. The same write data DIN is written into both normal selected cell 55 and redundant cell 53 in RAM storage cells 52. In a subsequent read cycle, the data being read from redundant cell 53 is delayed by margin delay buffer 28, but the data being read from normal selected cell 55 is not delayed. Sense amplifiers 58 sense and amplify both the delayed data from redundant cell 53 and the non-delayed data from normal selected cell 55, which is the output data. XOR gate 40 compares the data read by sense amplifiers 58 and flip-flop 31 latches the result to generate the timing failure signal FAIL.

To achieve a high density, each memory cell in RAM storage cells 52 is made as small as possible. The small devices in each memory cell have a very low current drive, and the bit lines that connect to these cell devices can be long and have a large capacitance. Thus the bit lines accessing RAM storage cells 52 do not usually have a full voltage swing as do logic gates. Sense amplifiers 58 can detect small voltage movements on the bit lines and amplify the signal to generate full-swing data outputs. Adding margin delay buffer 28 may be implemented in several ways. Some RAM's may have large swings on bit lines, and may tolerate insertion of a buffer before sense amplifiers 58. However, bit lines with small voltage swings may not tolerate addition of a buffer.

Figure 10:
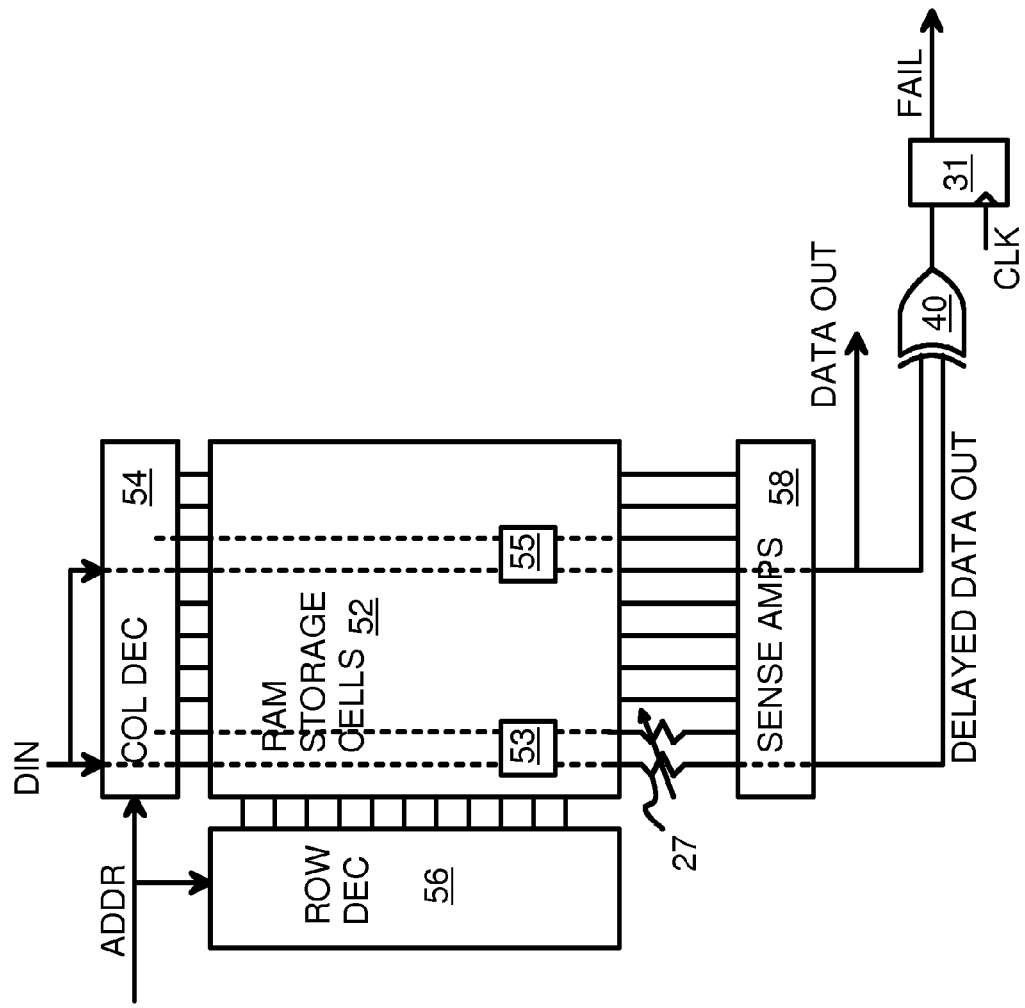
FIG. 10 shows adding margin delay to bit lines by inserting variable resistors before the sense amplifiers.

FIG. 10 shows adding margin delay to bit lines by inserting variable resistors before the sense amplifiers. DRAM cells may include one small capacitor and a pass transistor that connects the cell capacitor to a single bit line. Charge is shared between the bit line and the cell capacitor. Since the cell capacitor is small to achieve high density, and the bit line tends to be long with a large capacitance, a very small voltage swing may occur when reading a DRAM cell.

SRAM cells are usually large than DRAM cells. SRAM cells typically have a latch or other bistable element to store a data bit, and a pair of pass transistors to connect the cell to a pair of bit lines. During reading of and SRAM cell, one bit line is driven low and the other bit line is driven high.

Normal selected cell 55 and redundant cell 53 are SRAM cells in RAM storage cells 52. Two bit lines connect to normal selected cell 55 and to a differential sense amplifier in sense amplifiers 58 that amplifies the difference in voltage or current between the two bit lines and amplifies this difference to generate DATA OUT.

Two other bit lines connect to redundant cell 53. Rather than directly connect to sense amplifiers 58, these two bit lines from redundant cell 53 connect to variable resistors 27 and then to the inputs of sense amplifiers 58. The voltage difference of the bit lines after variable resistors 27 is input to sense amplifiers 58 to generate the delayed data output. XOR gate 40 compares the delayed data output to the normal data output and the result is latched by flip-flop 31 to generate the timing failure signals FAIL.

As the resistance of variable resistors 27 is increased, the delay to the input of sense amplifiers 58 increases. As the resistance and delay increases, eventually the delayed data output is too slow to be compared by XOR gate 40 and latched into flip-flop 31 before the next CLK, and a failure is signaled.

Figure 11:
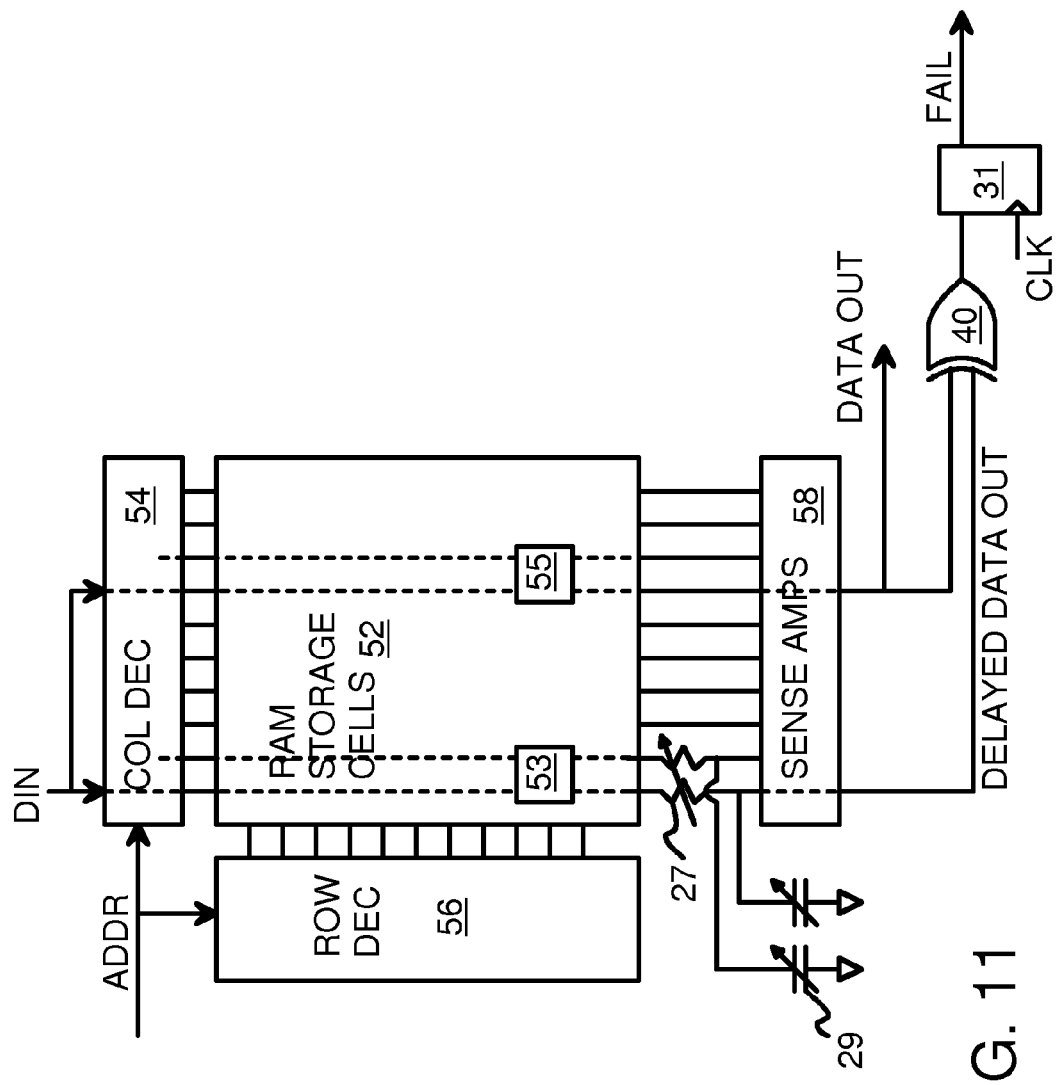
FIG. 11 shows adding margin delay to bit lines by inserting variable resistors and variable capacitors before the sense amplifiers.

FIG. 11 shows adding margin delay to bit lines by inserting variable resistors and variable capacitors before the sense amplifiers. Variable resistors 27 are inserted between bit lines from spare columns of RAM storage cells 52 and the input of sense amplifiers 58. Additionally, variable capacitors 29 are added on the sense-amp inputs, after variable resistors 27. The RC time delay during reading that is added by variable resistors 27 and variable capacitors 29 may be adjusted by margin delay adjustment controller 430 (FIG. 5) to increase the sensing delay of redundant cell 53 by sense amplifiers 58.

Figure 12:
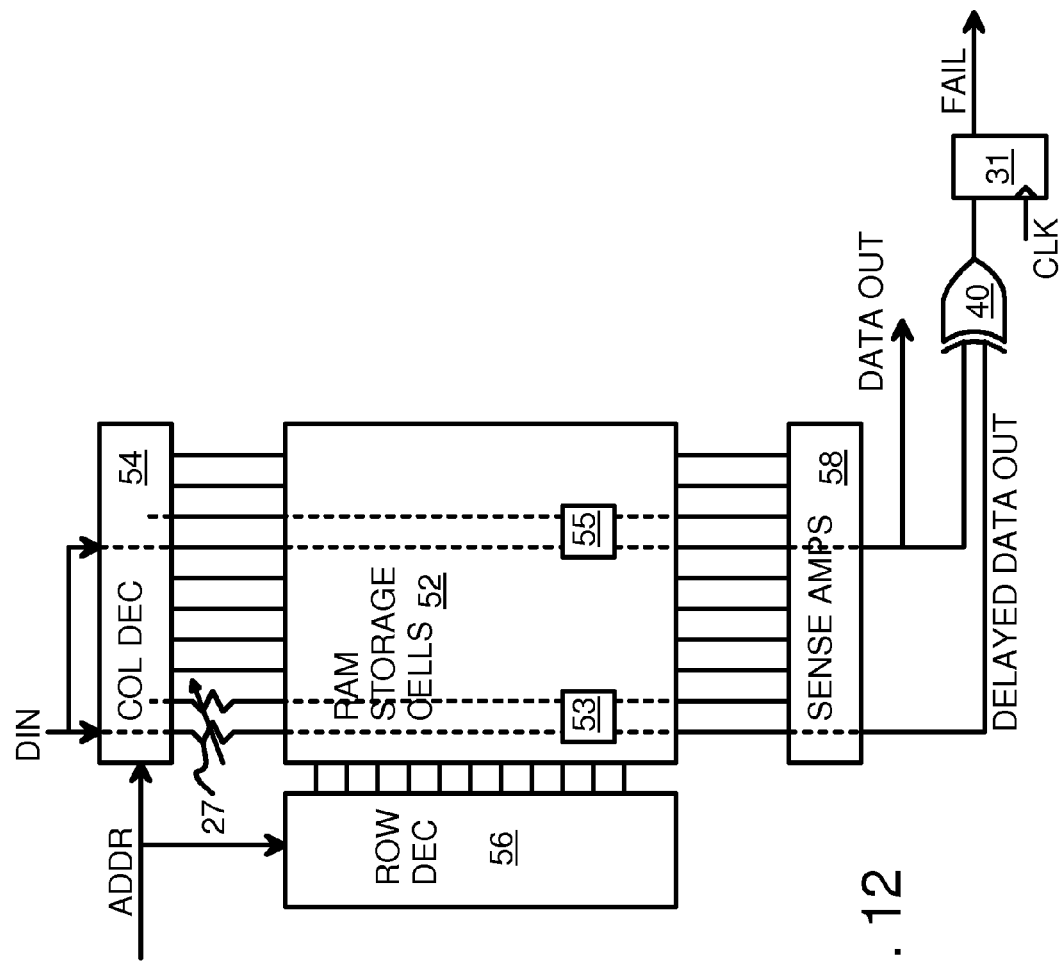
FIG. 12 shows variable resistors inserted between data write drivers and bit lines to add a variable margin delay when writing data.

FIG. 12 shows variable resistors inserted between data write drivers and bit lines to add a variable margin delay when writing data. The write data DIN is applied to driver buffers that drive selected bit lines to RAM storage cells 52. The data is written to normal selected cell 55 without added delay, and also to redundant cell 53 with an added variable delay. Variable resistors 27 are added between the write drivers in column decoder 54 and the tops of bit lines in RAM storage cells 52 to redundant cell 53. As the resistance of variable resistors 27 is increased, the write delay increases until the write data is not fully written into redundant cell 53 and the write data is stored. On a subsequent read of redundant cell 53 and normal selected cell 55, XOR gate 40 can detect the data mis-match and signal timing failure FAIL.

Alternate Embodiments

Several other embodiments are contemplated by the inventors. For example many kinds and arrangements of logic gates and logic structures are possible, including NAND, NOR, AND, OR, XOR, NXOR, and various combinations, etc. Many toggling functional critical paths 310, . . . 312 may be used, each with different applied test patterns from toggling pattern generator 114. Some paths could be toggled frequently while other paths are toggled very rarely, some remaining in a high state and other paths remaining in a low state between pulses. The toggling functional critical paths 310, . . . 312 may differ in logic, and some may be copies of actual functional critical paths, such as functional critical path 110, while other toggling functional critical paths 310, . . . 312 may be representational, with many variations in logic arrangements and loading possible. Some functional critical paths 110, . . . 112 or toggling functional critical paths 310, . . . 312 may contain RAM 15 while others do not contains RAM 15. Some critical paths may apply an address to RAM 15 and read data out of that address in the same cycle of CLK. Other critical paths may toggle other control signals such as a W/R control signal, an enable control signal, or a latch control signal. RAM 15 may have many ports, or separate RAMs or portions of RAM 15 may be used for different critical paths.

In some embodiments, RAM 15 may be an asynchronous RAM, with logic being applied to its address inputs, and data being read and output after an address-to-data access time, $T_{AA}$. In other embodiments, RAM 15 may be a synchronous RAM and may be clocked by CLK or a derivative. Data may require a multiple of CLK cycles to be output from RAM 15. Latches may be present inside the RAM block. Critical paths may begin or end inside the RAM block at these latches. Different kinds of sensor circuits may be used. Representation rather than replica critical paths may be used rather than the actual critical paths that carry user data or other system-critical signals. Redundant cell 53 may be shared for all columns of data in that row. The clock to flip-flop 31 may be carefully controlled to capture the compare result during a precise timing window. Flip-flop 31 may not be needed in some embodiments, such as when sense amps 58 are latching.

Toggling functional critical path 310 (FIG. 6) may be an exact replica of the logic of a functional critical path, such as functional critical path 110. The fan out, gate sizes and combinations, wire lengths, loading, and even orientation and location can be matched as closely as possible. Toggling functional critical path 310 may also be a representational path that represents the expected worst-case loading, fan out, and delays.

The toggling test patterns from toggling pattern generator 114 could remain on even when the chip is suspended or put into a low-power state, or could be turned off. While a rising edge CLK has been described, flip-flops that use the falling edge of CLK or of another clock may be used. Multiple clocks may be used. While XOR gates have been shown, exclusive-NOR (XNOR) gates could be substituted with inverted output signals.

RAM 15 could use the same VDD as other logic gates in functional critical path 110 or in toggling functional critical path 310, or RAM 15 could have its own VDD, perhaps set by a separate controller 130 or 430 that measures delays in RAM 15. VDD might be higher for RAM 15, such as to improve data retention, or lower, such as to reduce power.

When RAM storage cells 52 contain DRAM cells, there may be only one bit line per cell, and then only one variable resistor 27 is needed. Alternately, some RAM arrays may use a pair of DRAM cells to store each data bit, with true data being written into one DRAM cell and complement data written into the other DRAM cell for each bit. Both DRAM cells are read at the same time, causing one bit line to rise (or not fall) and the other bit line to fall, similar to a SRAM cell. Sense amplifiers 58 can then use differential sensing, as with a SRAM. The size of variable resistors 27 and variable capacitors 29 may be determined by circuit simulation or modeling to not disturb the sensing of redundant cell 53. The may be many redundant cells 53, such as one for each row in RAM storage cells 52.

A chip could have several voltage islands or domains. One domain could be powered with one VDD voltage, while another domain could be powered with a different VDD voltage. Separate voltage domains could be used for memory arrays, logic, processors, analog circuits, and I/O. Each voltage domain could have its own functional critical paths, sensors, and VDD controller.

In FIG. 4B, a timing hazard occurs since the data clocked into the next-stage flip-flop is not guaranteed to be correct. The flip-flop could become meta-stable or unstable if the D input was at an intermediate voltage level rather than high or low, and this instability could resolve itself at some unknown time in the future. Having only one critical path sensor could be dangerous if such instability were to occur. However, having several critical paths that are sensed at the same time can reduce this danger, since each critical path has a slightly different delay.

A LSSD scan chain may include all of first-level flip-flops 12, 24, next-level flip-flop 16, and third-level flip-flop 46 (FIG. 3, etc.). The levels are arbitrary since logic signals can wrap backwards among any of the flip-flops. Combinatorial logic 50 and combinatorial logic 24 may be part of the same logic block and are shown separately as a teaching aid rather than as a real circuit division. RAM 15 may be shared among several critical paths. While flip-flops 12, 14, 16, 46 have been shown using the same clock CLK, latches could be substituted. CLK could be replaced by two-phase non-overlapping clocks, with combinatorial logic between each phase latch. Registers that store state could be designed in RTL and implemented as D-type flip-flops, testable or scan-chain D-type flip-flops, muxed-input or flip-flops with a second test clock, toggle flip-flops, J-K flip-flops, transparent latches, S-R latches, and various combinations.

While measuring the delay of functional critical path 110 has been described as occurring during a test mode when functional data is paused, timing delays could also be measured during normal operation when the test mode is not active. This is especially true when margin delay buffer 28 is present, since early capture flip-flop 26 in the timing sensor will fail before next-level flip-flop 16 in the functional data path. Test mode may be necessary to ensure that state transitions occur since normal functional data may not toggle next-level flip-flop 16 for long periods of time, depending on the functions being performed. Having many functional critical paths 110, 111, . . . 112 can improve controller 130 accuracy since more paths are checked for timing. Likewise, having many toggling functional critical paths 310, . . . 312 can improve accuracy of margin delay adjustment controller 430.

Other kinds of flip-flops, accumulators, S-R latches, or flag registers may be substituted. In particular, a multi-bit accumulator could be added that counts a number of validated timing failures that have occurred since the accumulator was last cleared. Controller 130 may use the count value to determine how large of a change to make to VDD and controller 430 could use the count value to determine how much to change the margin delay. Many variations and different types of timing sensors could be substituted, such as edge-triggered, sensors with or without margin delays, sensors with delays capture clocks, etc. Many kinds of memory arrays could be used, such as DRAM, SRAM, flash, ROM, etc.

The delay generated by margin delay buffer 28 may be partially variable. A metal mask option may be used to set part of these delays, or the delay may be set during design after careful statistical or other analysis. These delays may have both a fixed delay component and a programmable delay component. The programmable delays may be controlled by controller 130. Controller 130 may sweep these delays across a range of increments. Controller 130 may adjust the margin delay, VDD, and the clock frequency using a closed control loop. A Delay-Locked Loop (DLL) may be used, muxes or switches to bypass a variable number of delay buffers, to add capacitance or resistance delays, or other programmable methods to allow the controller to set margin delays or other delays. The increment for the delay adjustment may be larger than the corresponding VDD increment. Controller 130 may use VDD adjustment as a finer control and margin delay adjustment as a coarse control. Ideally, the margin delay is large enough to accommodate any expected jumps in VDD due to adjustments to IVR 136, PMIC 138, or local voltage regulator 540.

When VDD is set too high, transistor speed may be so high that the delay through margin delay buffer 28 may be too small to distinguish between next-level flip-flop 16 and early capture flip-flop 26. Toggling pattern generator 114 could toggle at a divided rate, such as once every two CLK periods.

The controller could use an initial nominal VDD value and then increase VDD when no failures are detected for several cycles. VDD may be decreased when a failure occurs for a valid state change. Once a maximum or minimum VDD is reached, no further VDD changes are allowed. In some embodiments, the clock frequency then might be changed, such as by adjusting a Phase-Locked Loop (PLL) of other clock generator. VDD could be increased by larger increments than by the decrement increment, and the size of the increment could be a function of the number of timing failures detected.

Controllers may account for changes in temperature, aging, wear of the circuit, voltage drops, or other phenomena. Whatever causes speed changes in the circuit is accounted for by measuring the actual timing delays of functional critical paths compared with set-up timing requirements to flip-flops, either with or without added timing margin. There may be additional inputs to margin delay adjustment controller 430 or to controller 130.

Some embodiments may not use all components. For example, registers, gates, switches, etc. may be added or deleted in some embodiments. Inversions may be added by swapping inverting and non-inverting inputs as desired, but do not change the overall function and thus may be considered equivalents. Clocks may be inverted. Active-low clocks could be used that have non-overlapping low-going pulses rather than non-overlapping high-going pulses.

Capacitors, resistors, and other filter elements may be added. Gates could employ n-channel transistors, p-channel transistors, or transmission gates with parallel n-channel and p-channel transistors, or more complex circuits, either passive or active, amplifying or non-amplifying. Software, firmware, hardware, and various combinations may be used for sorting and selecting critical paths and for controllers 130, 430, global controller 534, and other components.

Additional components may be added at various nodes, such as resistors, capacitors, inductors, transistors, extra buffering, etc., and parasitic components may also be present. Enabling and disabling the circuit could be accomplished with additional transistors or in other ways. Pass-gate transistors or transmission gates could be added for isolation.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A memory sensor comprising:
   a redundant cell that is selected by a row decoder in response to a row address;
   a plurality of bit lines including a selected bit line that is connected to a normal selected cell during reading, and a redundant bit line that is connected to a redundant cell during reading;
   a plurality of sense amplifiers that receive the plurality of bit lines and sense data on the selected bit line to generate a data output;
   a read delay generator, coupled between the redundant bit line and the plurality of sense amplifiers, for delaying reading of the redundant cell over the redundant bit line; wherein the plurality of sense amplifiers also generates a delayed data output by sensing data on the redundant bit line after delay by the read delay generator;
   a compare gate that compares the data output to the delayed data output to generate a mismatch signal; and
   a failure latch that receives the mismatch signal and generates a timing failure signal that indicates that the delayed data output does not match the data output, whereby the timing failure signal is generated when delayed data read from the redundant cell does not match data read from the normal selected cell.

2. The sensor of claim 1, further comprising:
   an array of random access memory (RAM) storage cells;
   the row decoder receiving a row portion of the address, for activating a row in a plurality of rows that access the array of RAM storage cells.

3. The sensor of claim 2, wherein a column decoder receives a column portion of the address, for activating a column in a plurality of column that access the array of RAM storage cells.

4. The sensor of claim 3, wherein the normal selected cell is selected by the row decoder and by the column decoder in response to the address.

5. The sensor of claim 1, wherein the read delay generator comprises a variable resistor coupled between the redundant bit line from the redundant cell and an input to the plurality of sense amplifiers; wherein delay is increased as resistance of the variable resistor is increased.

6. The sensor of claim 1 wherein the read delay generator is a variable capacitor coupled to the redundant bit line; wherein delay is increased as capacitance of the variable capacitor is increased.

7. The sensor of claim 1, wherein the redundant cell and the normal selected cell are static random-access memory (SRAM) cells each connected to a pair of bit lines;
   wherein the plurality of sense amplifiers comprise differential amplifiers that each compare a pair of bit lines;
   wherein the read delay generator comprises:
      a true variable resistor coupled between a true input to a delayed sense amplifier in the plurality of sense amplifiers and a true redundant bit line that is connected to the redundant cell;

a complement variable resistor coupled between a complement input to the delayed sense amplifier in the plurality of sense amplifiers and a complement redundant bit line that is connected to the redundant cell; wherein the delayed sense amplifier generates the delayed data output.

8. The sensor of claim 1 further comprising: a write delay generator, coupled between a write data driver and the redundant bit line, for delaying writing data into the redundant cell over the redundant bit line.

9. The sensor of claim 8, wherein the write delay generator is a variable resistor coupled between the write data driver and the redundant bit line to the redundant cell; wherein delay is increased as resistance of the variable resistor is increased.

10. The sensor of claim 1 further comprising: a power-supply voltage controller that increases a power-supply voltage to the RAM timing sensor when the timing failure signal is activated, and for decreasing the power-supply voltage when the timing failure signal is not activated for a period of time, whereby the power-supply voltage is adjusted in response to timing failures detected from the array of RAM storage cells.

11. The sensor of claim 1 further comprising: a toggling data generator that generates constantly toggling data that is written to the normal selected cell and to the redundant cell or that is applied as a portion of the row address to toggle row selection during reading.

12. The sensor of claim 1 further comprising: a margin delay adjustment controller, receiving a plurality of the timing failure signals from a plurality of the RAM timing sensor, the margin delay adjustment controller adjusting a margin delay generated by the read delay generator over a range of variable delays to find a minimum variable delay value that causes the timing failure signal to be activated.

13. The sensor of claim 12, wherein the minimum variable delay value from the margin delay adjustment controller is applied to the read delay generator of a second plurality of the RAM timing sensor to adjust a variable delay of the delayed data output from the second plurality of the RAM timing sensor.

14. The sensor of claim 13, further comprising: a power-supply voltage controller that increases a power-supply voltage to the RAM timing sensor when the timing failure signal is activated by a RAM timing sensor in the second plurality of the RAM timing sensor, and for decreasing the power-supply voltage when the timing failure signal is not activated for a period of time, whereby the power-supply voltage is adjusted in response to timing failures detected from the array of RAM storage cells.

15. A memory sensor system comprising:
a plurality of functional critical paths powered by a power-supply voltage;
a critical path in the plurality of functional critical paths, the critical path including a delay through a memory device;
a plurality of functional critical path timing sensors, each functional critical path timing sensor receiving a functional delayed output from one of the plurality of functional critical paths that is delayed by a variable functional delay buffer, each functional critical path timing sensor activating a functional timing failure signal when the functional delayed output does not meet a set-up time to a functional clocked register; wherein a delay of the variable functional delay buffer is adjustable; and a power-voltage controller that receives the functional timing failure signals from the plurality of functional critical path timing sensors, the power-voltage controller increasing the power-supply voltage when a functional timing failure signal is received, the power-voltage controller decreasing the power-supply voltage when the functional timing failure signal is not received over a period of time, whereby the power-supply voltage is adjusted in response to detected timing failures.

16. The system of claim 15, wherein the memory device comprises random access memory (RAM).

17. The system of claim 14, wherein the variable functional delay buffer for the critical path is a variable resistor connected between a redundant bit line in the memory device and a sense amplifier for the memory device that generates the functional delayed output for the critical path.

18. The system of claim 14, wherein a redundant cell connected to the redundant bit line, and a normal selected cell are simultaneously read when the critical path is activated to generate the functional delayed output, wherein the normal selected cell causes the sense amplifiers to generate a functional output that is not delayed.

19. The system of claim 15, wherein the delay through the memory device is an address-to-output access time, wherein the critical path includes an address input to the memory device and a data output from the memory device.

20. The system of claim 15, wherein the plurality of functional critical paths are each driven with user data.

21. The system of claim 20 further comprising:
a plurality of toggling functional critical paths that are each driven with a constantly toggling input;
a plurality of toggling functional critical path timing sensors that detect when an output of a toggling functional critical path that is delayed through a toggling margin delay buffer fails to meet a set up timing requirement to a clocked register, the plurality of toggling functional critical path timing sensors generating a plurality of toggling timing failure signals;
a margin delay adjustment controller, receiving the plurality of toggling timing failure signals from the plurality of toggling functional critical path timing sensors, the margin delay adjustment controller adjusting a margin delay of the functional delayed output over a range of variable delays to find a minimum variable delay value that causes the toggling timing failure signals to be activated; wherein the minimum variable delay value from the margin delay adjustment controller adjusts a variable delay of the variable functional delay buffer; whereby the power-supply voltage is adjusted in response to the functional timing failure signals using variable delays adjusted by the margin delay adjustment controller in response to the toggling timing failure signals.

22. An integrated circuit system comprising:
a plurality of registers for storing internal signals in response to a clock;
combinatorial logic between inputs and outputs of the plurality of registers;
a memory array having address inputs in the combinatorial logic and having a data output into the combinatorial logic;
a plurality of functional critical paths in the combinatorial logic; wherein the plurality of functional critical paths carry real data and control information during normal modes of operation rather than being dummy paths having no functional use; and a functional critical path timing sensor for each functional critical path in the plurality of functional critical paths, each functional critical path driving a next-level input to a next-level register in the plurality of registers, wherein the functional critical path timing sensor generates a functional timing failure signal when data passing through a functional critical path arrives at the next-level input after a trigger time; wherein the trigger time is a margin time plus a set-up time for the next-level input relative to the clock to the next-level register;

a margin delay adjustment controller for adjusting the margin time; wherein the functional timing failure signal is generated by sensing a delay through the functional critical path relative to the trigger time for the next-level register using actual components of the functional critical path, including the memory array, under current process, temperature, and voltage conditions with margin times adjusted by the margin delay adjustment controller.

23. The system of claim 22 further comprising: a VDD controller that receives the functional timing failure signal from the functional critical path timing sensor, the VDD controller causing a power-supply voltage to the plurality of registers and to the combinatorial logic to be increased when the functional timing failure signal is received, the VDD controller causing the power-supply voltage to be reduced when no functional timing failure signal is received for a period of time, wherein the power-supply voltage is adjusted to compensate for functional timing failures detected through the functional critical paths.

24. The system of claim 23, wherein each functional timing sensor for a functional critical path passing through the memory array comprises:

a variable delay element within the memory array, the variable delay element adding the margin time to a read access time to delay reading of a redundant cell in the memory array relative to reading of a normal selected cell in the memory array; and a compare gate that compares data read from the redundant cell to data read from the normal selected cell activates the functional timing failure signal when data does not match.

25. A memory sensor system comprising:

means for selecting a redundant cell in response to a row address;

means for selecting a bit line from a plurality of bit lines that is connected to a normal selected cell during reading, and a redundant bit line that is connected to a redundant cell during reading;

means for sensing data on the selected bit line to generate a data output;

a read delay generator, coupled between the redundant bit line and the means for receiving and sensing data on the selected bit line, for delaying reading of the redundant cell over the redundant bit line; wherein the means sensing data on the selected bit line also generates a delayed data output by sensing data on the redundant bit line after delay by the read delay generator;

a compare gate that compares the data output to the delayed data output to generate a mismatch signal; and a failure latch that receives the mismatch signal and generates a timing failure signal that indicates that the delayed data output does not match the data output, whereby the timing failure signal is generated when delayed data read from the redundant cell does not match data read from the normal selected cell.

26. The system of claim 25, wherein the means sensing data on the selected bit line comprises a plurality of sense amplifiers.

27. The system of claim 25, wherein the means for selecting the redundant cell comprises a row decoder, the system further comprising:

an array of random access memory (RAM) storage cells; the row decoder receiving a row portion of the address, for activating a row in a plurality of rows that access the array of RAM storage cells.

28. The system of claim 27, wherein a column decoder receives a column portion of the address, for activating a column in a plurality of column that access the array of RAM storage cells.

29. The system of claim 28, wherein the normal selected cell is selected by the row decoder and by the column decoder in response to the address.

30. The system of claim 25, wherein the read delay generator comprises at least one of a variable resistor and a variable capacitor.

* * * * *

UNITED STATES PATENT AND TRADEMARK OFFICE
CERTIFICATE OF CORRECTION

PATENT NO. : 9,536,625 B1  
APPLICATION NO. : 14/800528  
DATED : January 3, 2017  
INVENTOR(S) : Quinton et al.

Page 1 of 1

It is certified that error appears in the above-identified patent and that said Letters Patent is hereby corrected as shown below:

On the Title Page

Item (72) Inventors, should read:
--(72) Inventors: Bradley Quinton, Vancouver (CA);
 Trent McClements, Burnaby (CA);
 Andrew Hughes, Vancouver (CA);
 Sanjiv Taneja, Cupertino, CA (US);
 Michael Lee, Vancouver (CA)--.

Signed and Sealed this
Sixth Day of June, 2017

Michelle K. Lee
*Director of the United States Patent and Trademark Office*